United States Patent
Sung et al.

(10) Patent No.: US 8,222,529 B2
(45) Date of Patent: Jul. 17, 2012

(54) CERAMIC SUBSTRATE AND MANUFACTURING METHOD THEREOF

(75) Inventors: Je Hong Sung, Hwaseong-si (KR); Jin Waun Kim, Hwaseong-si (KR); Myung Whun Chang, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 306 days.

(21) Appl. No.: 12/588,502

(22) Filed: Oct. 16, 2009

(65) Prior Publication Data

US 2011/0042131 A1  Feb. 24, 2011

(30) Foreign Application Priority Data

Aug. 20, 2009  (KR) .................. 10-2009-0077105

(51) Int. Cl.
*H05K 1/03* (2006.01)

(52) U.S. Cl. ........ 174/255; 174/256; 174/257; 174/258; 174/260; 174/262; 174/264; 29/825; 29/830; 29/843; 29/846; 29/852; 438/108; 438/616

(58) Field of Classification Search .................. 174/255, 174/256–258, 260, 262, 264; 29/825, 830, 29/843, 846, 852; 438/108, 616
See application file for complete search history.

(56) References Cited

U.S. PATENT DOCUMENTS

| | | | | |
|---|---|---|---|---|
| 5,329,695 A * | 7/1994 | Traskos et al. | ................ | 29/830 |
| 5,627,344 A * | 5/1997 | Tanifuji et al. | ................ | 174/257 |
| 5,872,695 A * | 2/1999 | Fasano et al. | ................ | 361/301.4 |
| 5,958,628 A * | 9/1999 | Balz et al. | ................ | 430/5 |
| 6,408,511 B1 * | 6/2002 | Branchevsky | ................ | 29/843 |
| 6,429,114 B1 * | 8/2002 | Hayama et al. | ................ | 438/616 |
| 6,528,145 B1 * | 3/2003 | Berger et al. | ................ | 428/156 |
| 6,800,815 B1 * | 10/2004 | Ehlert et al. | ................ | 174/262 |
| 7,569,925 B2 * | 8/2009 | Nishizawa et al. | ................ | 257/700 |
| 7,669,320 B2 * | 3/2010 | Hurwitz et al. | ................ | 29/846 |
| 2001/0031690 A1 * | 10/2001 | Chikagawa et al. | ................ | 501/32 |
| 2002/0094604 A1 * | 7/2002 | Hayama et al. | ................ | 438/108 |
| 2002/0100966 A1 * | 8/2002 | Hayama et al. | ................ | 257/700 |
| 2002/0134488 A1 * | 9/2002 | Harada et al. | ................ | 156/89.12 |
| 2003/0000079 A1 * | 1/2003 | Harada et al. | ................ | 29/830 |
| 2006/0109632 A1 * | 5/2006 | Berlin et al. | ................ | 361/719 |
| 2008/0188366 A1 * | 8/2008 | Nakamura et al. | ................ | 501/32 |

(Continued)

FOREIGN PATENT DOCUMENTS

JP  2-126699  5/1990

(Continued)

OTHER PUBLICATIONS

Japanese Office Action issued Aug. 23, 2011 in corresponding Japanese Patent Application 2009-239675.

(Continued)

*Primary Examiner* — Xiaoliang Chen

(57) ABSTRACT

The present invention provides a ceramic substrate including: a ceramic stacked layer structure in which multiple ceramic layers are stacked to be interconnected through a via provided within each of the ceramic layers, the ceramic stacked layer structure having a hole provided therein to expose a top portion of the via provided within a ceramic layer of being a surface layer; a conductive material filled within the hole; and an external electrode formed on the surface of the ceramic stacked layer structure so that the external electrode is electrically connected to the conductive material, and a manufacturing method thereof.

7 Claims, 4 Drawing Sheets

U.S. PATENT DOCUMENTS

| | | | |
|---|---|---|---|
| 2011/0061910 A1* | 3/2011 | Sung et al. | 174/258 |
| 2011/0168439 A1* | 7/2011 | Chang et al. | 174/264 |

FOREIGN PATENT DOCUMENTS

| | | |
|---|---|---|
| JP | 07-307566 | 11/1995 |
| JP | 2000-286555 | 10/2000 |
| JP | 2006-278431 | 10/2006 |
| JP | 2006-286674 | 10/2006 |
| KR | 10-2001-0052848 | 6/2001 |
| KR | 10-0896649 B1 | 4/2009 |

OTHER PUBLICATIONS

Korean Office Action issued Feb. 1, 2011 in corresponding Korean Patent Application 10-2009-0077105.

* cited by examiner

[FIG. 1]
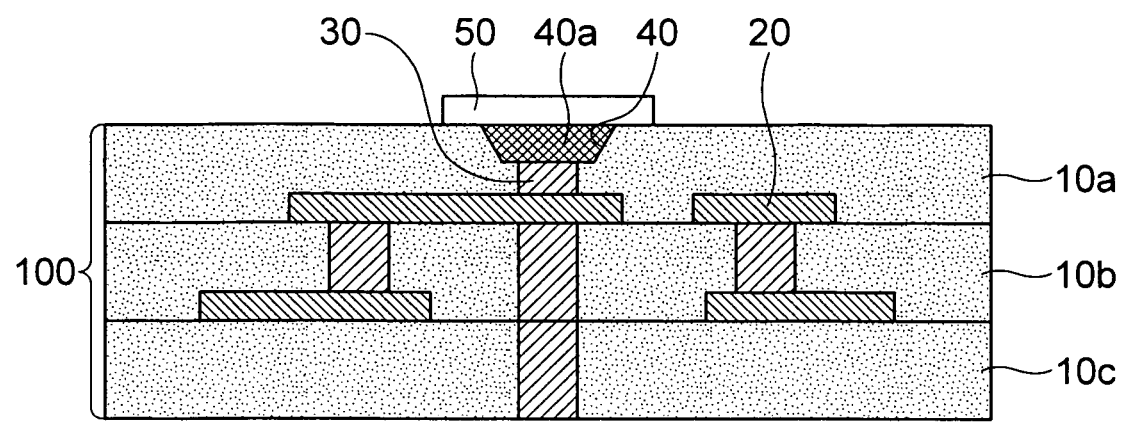
[FIG. 2]
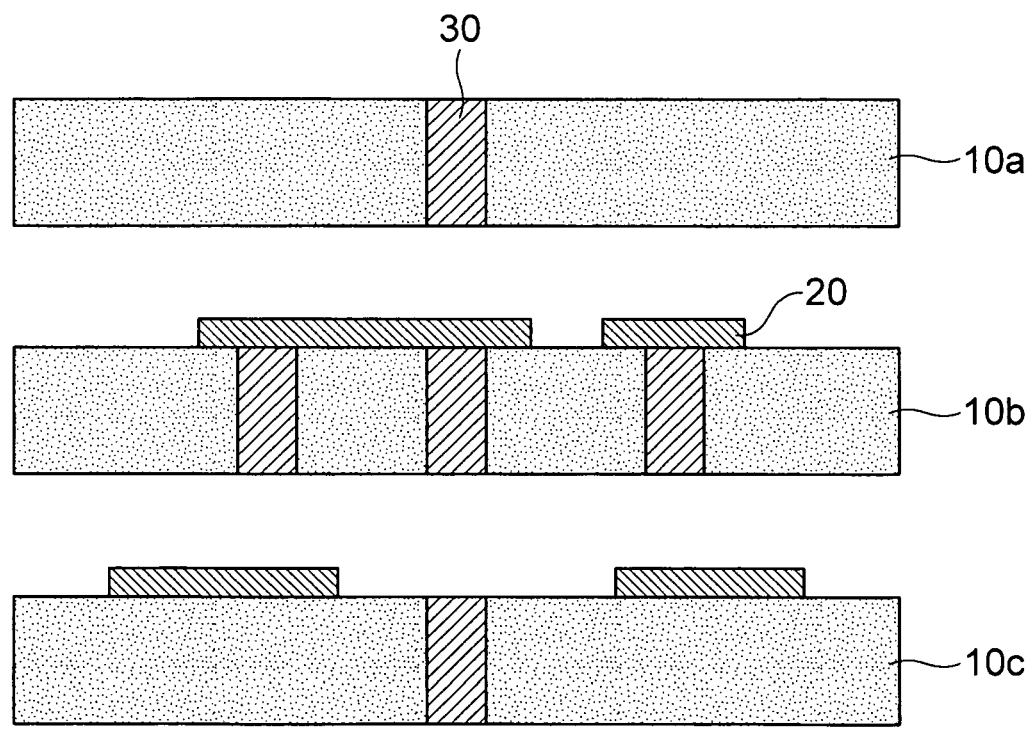

[FIG. 3]
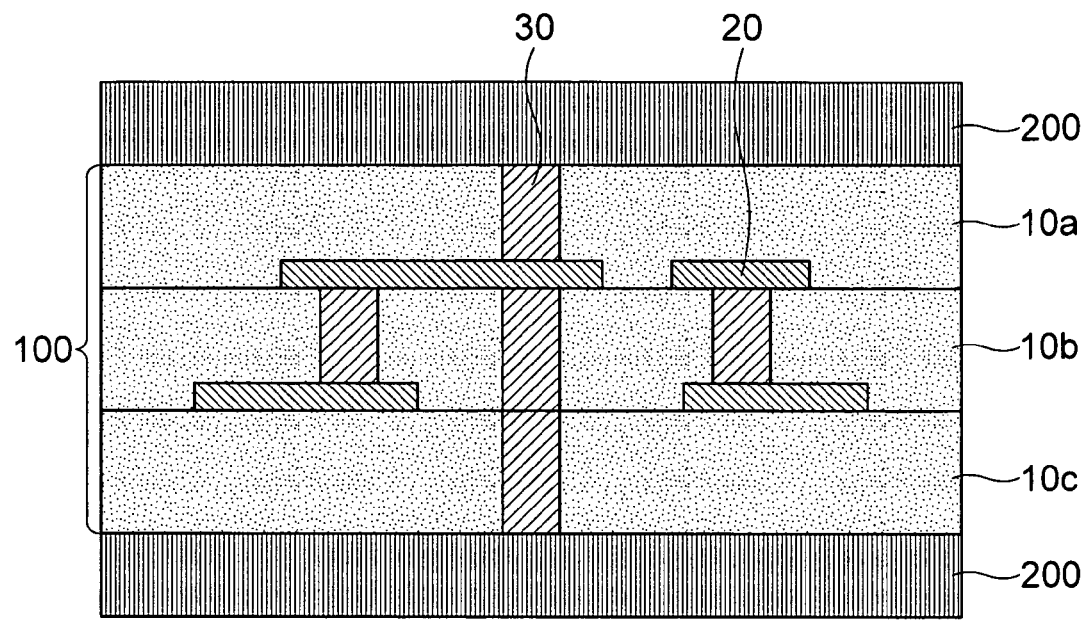
[FIG. 4]
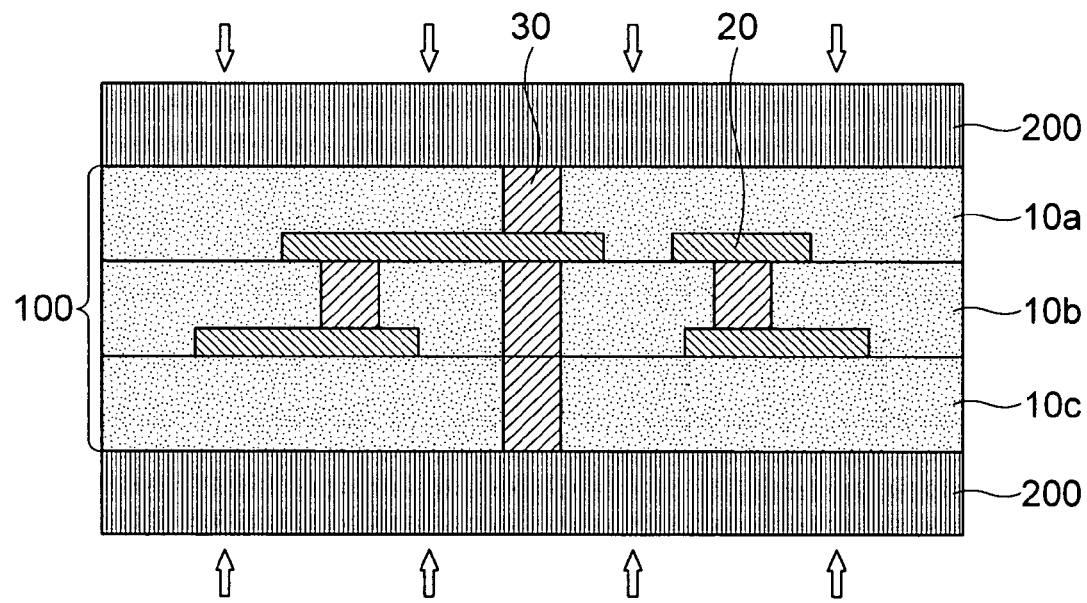

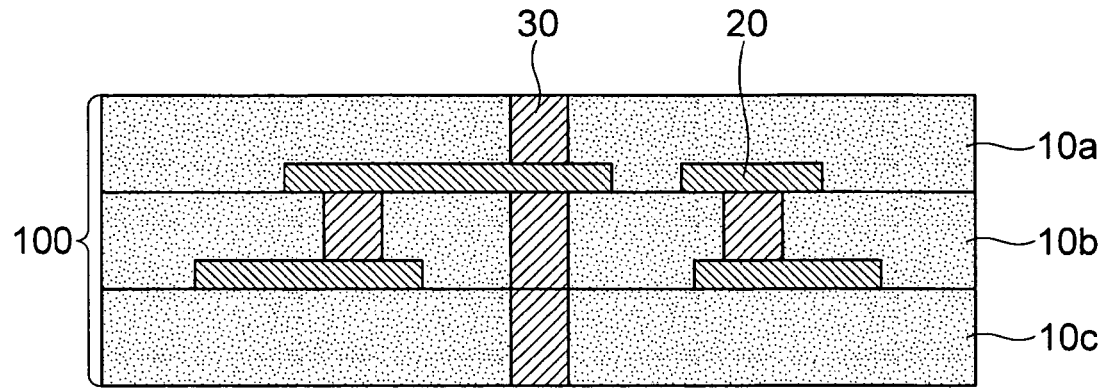
[FIG. 5]
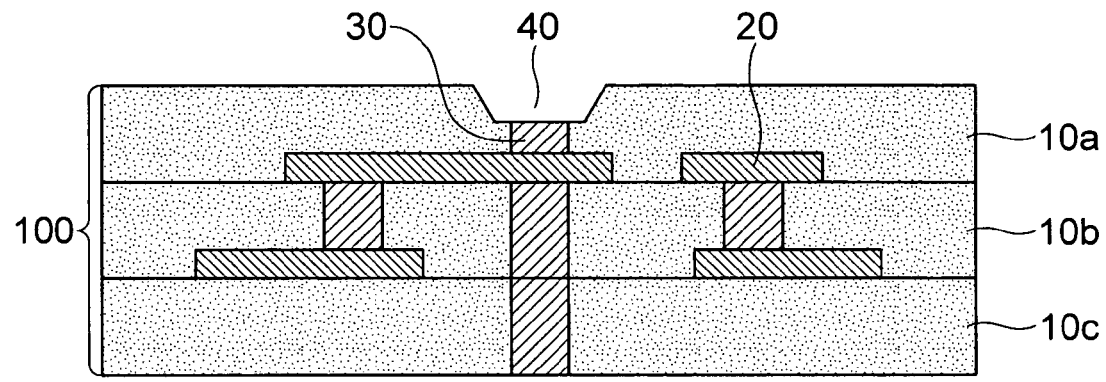
[FIG. 6]
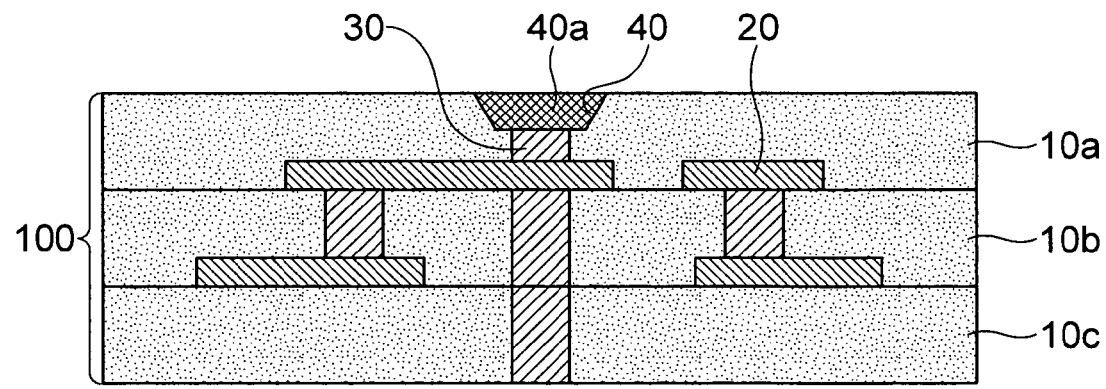
[FIG. 7]

[FIG. 8]
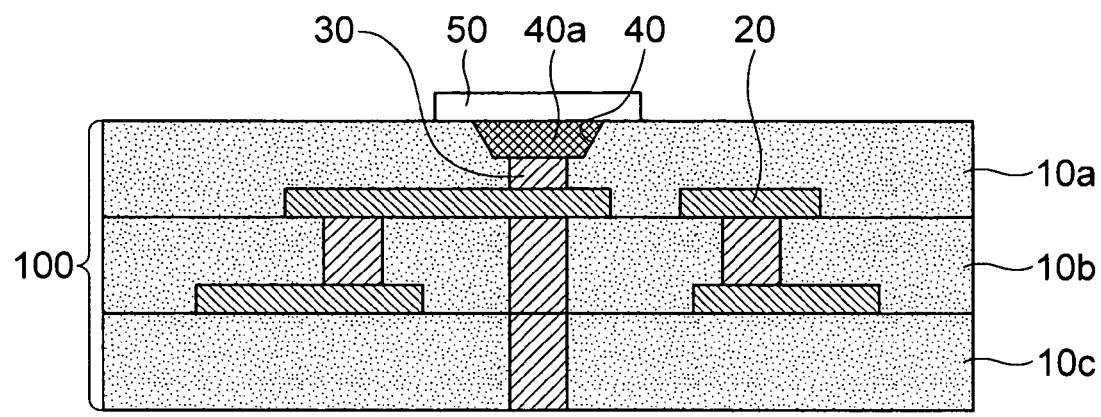

CERAMIC SUBSTRATE AND MANUFACTURING METHOD THEREOF

CROSS-REFERENCE TO RELATED APPLICATIONS

This application claims the benefit of Korean Patent Application No. 10-2009-0077105 filed with the Korea Intellectual Property Office on Aug. 20, 2009, the disclosure of which is incorporated herein by reference.

BACKGROUND OF THE INVENTION

1. Field of the Invention

The present invention relates to a ceramic substrate and manufacturing method thereof; and, more particularly, to a ceramic substrate having a hole, which is formed in a ceramic layer of being a surface layer in a ceramic stacked layer structure to expose a via and is filled with a conductive paste, and manufacturing method thereof.

2. Description of the Related Art

In line with the recent trend toward miniaturization of an electronic parts, much development for fine-patterning, precision, and thinness has been achieved even in a module and a substrate. However, in the case where a widely used PCB (Printed Circuit Board) is applied in miniaturized electronic parts, there has been many problems such as size's miniaturization, signal loss in a high frequency domain, and reduction in reliability at the time of high temperature and high humidity.

In order to overcome such problems, a ceramic-based substrate has been used instead of a PCB substrate. A main component of the ceramic substrate corresponds to a ceramic composition which contains a large amount of glass capable of low-temperature co-firing.

There exist various methods for manufacturing an LTCC (Low Temperature Co-fired Ceramic) substrate, which may be classified into shrinking and zero-shrinking according to whether or not the ceramic substrate is shrunk during a firing process. In particular, a method for manufacturing the ceramic substrate to be shrunk in firing refers to shrinking. However, in the case of the shrinking, non-uniform shrinkage occurs in the ceramic substrate, so dimensional change is produced along a surface direction of the substrate. Such shrinkage of the ceramic substrate in a surface direction causes deformation of patterns of a printed circuit included in the substrate, which results in deterioration of precision of pattern's position and disconnection of the patterns. Therefore, in order to solve the problems, zero-shrinking has been proposed that can prevent the ceramic substrate from being shrunk in the surface direction.

Herein, the zero-shrinking refers to a method for forming a constrained layer on the both surfaces of the ceramic substrate and firing the formed substrate. In this case, the constrained layer may be formed of a material, which is suitable for shrinkage control while allowing the substrate not to be shrunk at a temperature where the ceramic substrate is fired. Such a constrained layer allows the ceramic substrate to be shrunk only in a thickness direction while preventing the ceramic substrate from being shrunk in the surface direction, at the time of the firing.

In the case where a ceramic substrate is manufactured by employing the conventional zero-shrinking, it is possible to suppress shrinkage of the substrate in the surface direction when fired. However, in the case of a via vertically connected for interlayer-connection, the via fails to coincide with behavior of the LTCC firing, and constraint force for suppressing shrinkage of the substrate in the surface direction is difficult to apply, which results in defects of the substrate. In particular, in the case of a structure where defects around the via are exposed to a surface layer, the defects cause packaging-failure at the time of forming external patterns. That is, the defects around the via are provided in various forms such as voids, cracks, projection, depression, and so on, which causes packaging-failure and reliability-deterioration, such as wire bonding, an SMT, soldering, and so on.

SUMMARY OF THE INVENTION

The present invention has been proposed in order to overcome the above-described problems and it is, therefore, an object of the present invention to provide a ceramic substrate which can prevent reliability-deterioration of a substrate due to defects around a via, by removing a part of ceramic layers having the via formed therewithin to be exposed to a surface layer thereby to form a hole, and filling the hole with a conductive paste before performing a post-firing process, and a manufacturing method thereof.

In accordance with one aspect of the present invention to achieve the object, there is provided a ceramic substrate including: a ceramic stacked layer structure in which multiple ceramic layers are stacked to be interconnected through a via provided within each of the ceramic layers, the ceramic stacked layer structure having a hole provided therein to expose a top portion of the via provided within a ceramic layer of being a surface layer; a conductive material filled within the hole; and an external electrode formed on the surface of the ceramic stacked layer structure so that the external electrode is electrically connected to the conductive material.

Herein, the hole is formed to have a larger size than that of the via.

In accordance with another aspect of the present invention to achieve the object, there is provided a method for manufacturing a ceramic substrate including the steps of: providing a ceramic stacked layer structure in which multiple ceramic layers are stacked to be interconnected through a via provided within each of the ceramic layers; firing the ceramic stacked layer structure in non-shrinking; forming a hole exposing a top portion of the via, within the ceramic layer of being a surface layer of the ceramic stacked layer structure; filling the hole with a conductive material; and forming an external electrode electrically connected to the conductive material, on a surface of the ceramic stacked layer structure.

Herein, in the step of forming the hole, the hole is formed to have a larger size than that of the via.

Also, in the step of forming the hole, the hole is formed by a laser.

Also, the step of firing the ceramic stacked layer structure in non-shrinking includes the steps of: stacking constraint sheets fired at a temperature higher than a firing temperature of the ceramic layer, on top and bottom surfaces of the ceramic stacked layer structure; firing the constraint sheets at the firing temperature of the ceramic layer; and removing the constraint sheets.

Also, the method further includes a step of performing a lapping process on a surface of the ceramic stacked layer structure, after the step of removing the constraint sheets.

Also, in the step of filling the hole with the conductive material, the conductive material corresponds to a conductive paste which is filled by a screen printing scheme.

Also, the method further includes a step of performing a post-firing process on the conductive material, after the step of filling the hole with the conductive material.

Also, the method further includes a step of performing a polishing process on the surface of the ceramic stacked structure having the conductive material formed therein, after the step of post-firing the conductive material.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view showing a ceramic substrate in accordance with an embodiment of the present invention; and FIGS. 2 to 8 are cross-sectional view showing a process for manufacturing a ceramic substrate in accordance with an embodiment of the present invention.

DETAILED DESCRIPTION OF THE PREFERABLE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Further, the dimensions of layers and regions are exaggerated for clarity of illustration.

FIG. 1 is a cross-sectional view showing a ceramic substrate in accordance with an embodiment of the present invention.

As shown in FIG. 1, the ceramic substrate in accordance with the present invention may include a ceramic stacked layer structure 100, and an external electrode 50.

The ceramic stacked layer structure 100 may include ceramic layers 10a to 10c stacked in multiple layers. In this case, the ceramic layers 10a to 10c stacked in multiple layers are provided with a via 30, containing a conductive material, e.g., Ag paste, filled within a via hole (not shown) passing through the body of the ceramic stacked layer structure, so that interlayer-connection can be achieved.

Also, internal electrodes 20 electrically connected to the via 30 are further provided within the ceramic stacked layer structure 100.

The internal electrodes 20 may be formed in a screen printing scheme that uses a conductive paste such as Ag.

The via 30 vertically penetrating the ceramic layers 10a to 10c may be made by forming via holes on an appropriate position of each of the ceramic layers 10a to 10c in a punching scheme according to a module circuit diagram, and filling the resultant via holes with a conductive paste such as Ag.

In particular, among the ceramic layers 10a to 10c constituting the ceramic stacked layer structure 100 of the ceramic substrate in accordance with an embodiment of the present invention, the ceramic layer 10a of being a surface layer has a hole 40 formed therewithin to expose a top portion of the via 30.

The hole 40 may be formed by removing a part of the ceramic layer 10a, which has the via 30 formed therein to be exposed to the surface layer of the ceramic stacked layer structure 100, through a laser.

In this case, it is preferable that the hole 40 is formed to have a larger size than that of the via 30.

The hole 40 is filled with a conductive material 40a through which the via 30 is electrically connected to the hole 40. The conductive material 40a may be filled with a conductive paste like Ag by a screen printing scheme.

Meanwhile, the external electrode 50 is electrically connected to the conductive material 40a on the surface of the ceramic stacked layer structure 100. The external electrode 50 may be formed of a conductive paste like Ag, as in a case of the internal electrodes 20.

The formation of the ceramic substrate in accordance with an embodiment of the present invention is made by removing a part of the ceramic layer 10a having the via 30 formed therein to be exposed to the surface layer of the ceramic stacked layer structure 100, and forming the hole 40 which exposes the top portion of the via 30, and then re-filling the hole 40 with the conductive material 40a before performing post-firing, in order to remove defects around the via 30 (e.g. voids, cracks, projection, or depression) generated due to a shrinkage rate difference between the ceramic layers 10a to 10c and the via 30 at the time of the low temperature co-firing of the ceramic stacked structure 100.

As such, the ceramic substrate in accordance with an embodiment of the present invention can prevent the bonding strength between the external electrode 50 and the ceramic stacked layer structure 100 from being reduced due to the defects around the via 30, by forming the hole 40 so that the defects around the via 30 exposed to a surface of the ceramic stacked layer structure 100 can be removed, filling the hole 40 with the conductive material 40a, and forming the external electrode 50 on the conductive material 40a.

Therefore, according to the embodiment of the present invention, it is possible to form the external electrode 50 on the ceramic stacked layer structure 100, or to improve electrical reliability in a packaging process, such as post-SMT, wire bonding, and soldering.

Meanwhile, in the embodiment of the present invention, the ceramic stacked layer structure 100 is stacked with three ceramic layers 10a to 10c. However, this is only for convenience of description, and the present invention is not limited thereto.

Hereinafter, a detailed description will be given of a method for manufacturing a ceramic substrate in accordance with an embodiment of the present invention, with reference to FIGS. 2 to 8.

FIGS. 2 to 8 are cross-sectional view showing a process of manufacturing the ceramic substrate in accordance with an embodiment of the present invention.

First, as shown in FIG. 2, multiple ceramic layers 10a to 10c are prepared. It is preferable that the ceramic layers 10a to 10c have a firing temperature of about 800 to 1000° C. Thereafter, the internal electrodes 20 are formed at an appropriate position of the ceramic layers 10a to 10c according to a module circuit diagram.

Then, a part of the ceramic layers 10a to 10c is subjected to a punching process for formation of a via hole (not shown), the via hole is filled with a conductive paste, and the via 30 is formed to vertically penetrate a part of the ceramic layers 10a to 10c.

The internal electrodes 20 and the via 30 may be formed in a screen printing scheme using a conductive paste like Ag.

Thereafter, as shown in FIG. 3, the multiple ceramic layers 10a to 10c are stacked, thereby forming the ceramic stacked layer structure 100 in which interlayer-connection is achieved through the via 30.

Then, on the top and bottom surfaces of the ceramic stacked layer structure 100, constraint sheets 200 fired at a temperature (e.g. above 1500° C.) higher than a firing temperature of the ceramic layers 10a to 10c are stacked.

As for the constraint sheet 200, $Al_2O_3$ sheet may be used.

Then, as shown in FIG. 4, the resultant ceramic stacked layer structure 100 is compressed, and is subjected to a co-firing process at a firing temperature of the ceramic layers 10a to 10c.

That is, the firing process may be achieved at a low temperature of about 800~1000° C. In this case, shrinkage occurs in the ceramic layers 10a to 10c, but no shrinkage occurs in the constraint sheets 200 composed of $Al_2O_3$. Therefore, the ceramic layers 10a to 10c adhered to the constraint sheets 200 are prevented from being shrunk in the surface directions (x axis and y axis), and are shrunk only in a vertical direction (z axis), that is a thickness direction.

After co-firing, as shown in FIG. 5, the constraint sheets 200 are removed from the ceramic stacked structure 100.

The constraint sheets 200 may be removed through a washing process.

Thereafter, the surface of the ceramic stacked layer structure 100 may be subjected to a lapping process.

Herein, in the embodiment of the present invention, a method for using the constraint sheets is applied as a method for zero-shrinking the ceramic stacked layer structure 100. However, the present invention is not limited thereto. That is, zero-shrinking using the constraint sheets 200 is one of methods for implementing zero-shrinkage. In addition to the zero-shrinking, various zero-shrinking may be applied, such as a method for positioning a constrained layer according to each of the ceramic layers 10a to 10c, or a method for suppressing shrinkage of the substrate in the surface direction by controlling the composition of the ceramic layers 10a to 10c.

Meanwhile, in the case where the ceramic substrate is manufactured by employing the non-zero shrinking, it is possible to suppress shrinkage of the substrate in the surface direction at the time of the co-firing of the ceramic stacked layer structure 100. However, in the case of the via 30 vertically formed for interlayer-connection, the via 30 fails to coincide with firing behavior of the ceramic layers 10a to 10c and constraint force is difficult to contribute to the substrate, so defects of voids, cracks, projection, and depression occur around the via 30.

Therefore, in the embodiment of the present invention, in order to remove the defects about the via 30, the hole 40a is formed by removing a part of ceramic layer 10a having the via 30 formed therewithin to be exposed to the surface layer.

That is, as shown in FIG. 6, the hole 40 exposing the top portion of the via 30 is formed within the ceramic layer 10a of being the surface layer of the ceramic stacked layer structure 100.

Herein, the hole 40 may be formed to have a larger size than that of the via 30 so that it can remove defects around the via 30 generated after low-temperature co-firing.

In this case, the hole 40 may be formed by a laser.

Thereafter, as shown in FIG. 7, the hole 40 is filled with the conductive material 40a. The conductive material 40a may be formed of a conductive paste like Ag paste, and may be filled in a screen printing scheme.

Then, the conductive material 40a is subjected to a post-firing process.

Thereafter, as shown in FIG. 8, the external electrode 50 electrically connected to the conductive material 40a is formed on the surface of the ceramic stacked layer structure 100.

Herein, before forming the external electrode 50, the surface of the ceramic stacked layer structure 100 having the post-fired conductive material 40a formed therein is subjected to a polishing process, thereby ensuring flatness of the ceramic stacked layer structure 100.

According to the method for manufacturing the ceramic substrate in accordance with an embodiment of the present invention, it is possible to remove defects around the via 30 exposed to the surface layer, by removing a part of the ceramic layer 10a having the via 30 formed therewithin to be exposed to the surface layer of the ceramic stacked layer structure 100 having been subjected to a low-temperature co-firing process, and forming the hole 40 exposing the top portion of the via 30.

Therefore, in the embodiment of the present invention, the top portion of the via without the defects is filled with the conductive material 40a and the resultant via is subjected to a post-firing process, and the external electrode 50 is formed above the via 30, so that it is possible to prevent reliability of the substrate from being reduced due to defects around the via 30.

That is, in the embodiment of the present invention, it is possible to form the external electrode 50 on the ceramic stacked layer structure 100, or to electrically connect the external electrode 50 to the conductive material 40a in a packaging process, such as post-SMT, wire-bonding, and soldering.

Accordingly, the present invention can provide an effect capable of improving reliability of the non-shrinkage substrate, and lowering a defect rate of the substrate.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A method for manufacturing a ceramic substrate comprising:
    providing a ceramic stacked layer structure in which multiple ceramic layers are stacked to be interconnected through a via provided within each of the ceramic layers;
    firing the ceramic stacked layer structure in non-shrinking;
    forming a hole to expose a top portion of the via, by removing a part of the ceramic layer of being a surface layer of the ceramic stacked layer structure and a part of the via, wherein the hole is formed larger than the via;
    filling the hole with a conductive material; and
    forming an external electrode electrically connected to the conductive material, on a surface of the ceramic stacked layer structure.

2. The method of claim 1, wherein, in forming the hole, the hole is formed by a laser.

3. The method of claim 1, wherein the firing the ceramic stacked layer structure in non-shrinking comprises:
    stacking constraint sheets fired at a temperature higher than a firing temperature of the ceramic layer, on top and bottom surfaces of the ceramic stacked layer structure;

firing the constraint sheets at the firing temperature of the ceramic layer; and removing the constraint sheets.

4. The method of claim 3, further comprising performing a lapping process on a surface of the ceramic stacked layer structure, after removing the constraint sheets.

5. The method of claim 1, wherein, in filling the hole with the conductive material, the conductive material corresponds to a conductive paste which is filled by a screen printing scheme.

6. The method of claim 1, further comprising performing a post-firing process on the conductive material, after the filling the hole with the conductive material.

7. The method of claim 6, further comprising performing a polishing process on the surface of the ceramic stacked structure having the conductive material formed therein, after the post-firing the conductive material.

\* \* \* \* \*